United States Patent
Gasanov et al.

(10) Patent No.: US 7,111,267 B2
(45) Date of Patent: Sep. 19, 2006

(54) PROCESS AND APPARATUS TO ASSIGN COORDINATES TO NODES OF LOGICAL TREES WITHOUT INCREASE OF WIRE LENGTHS

(75) Inventors: Elyar E. Gasanov, Moscow (RU); Iliya V. Lyalin, Moscow (RU); Alexei V. Galatenko, Moscow (RU); Andrej A. Zolotykh, Moskovskaya Oblast (RU)

(73) Assignee: LSI Logic Corporation, Milpitas, CA (US)

( * ) Notice: Subject to any disclaimer, the term of this patent is extended or adjusted under 35 U.S.C. 154(b) by 104 days.

(21) Appl. No.: 10/928,799

(22) Filed: Aug. 27, 2004

(65) Prior Publication Data

US 2006/0048087 A1 Mar. 2, 2006

(51) Int. Cl.
*G06F 17/50* (2006.01)

(52) U.S. Cl. .............................. 716/10; 716/9; 716/13; 716/3

(58) Field of Classification Search ................... 716/13, 716/3, 9, 10
See application file for complete search history.

(56) References Cited

U.S. PATENT DOCUMENTS

| | | | |
|---|---|---|---|
| 6,505,331 B1 * | 1/2003 | Bracha et al. ................. | 716/12 |
| 6,513,148 B1 | 1/2003 | Gasanov et al. ............... | 716/10 |
| 6,543,032 B1 | 4/2003 | Zolotykh et al. .............. | 716/2 |
| 6,564,361 B1 | 5/2003 | Zolotykh et al. .............. | 716/8 |
| 6,637,016 B1 | 10/2003 | Gasanov et al. ............... | 716/12 |
| 2005/0210422 A1 * | 9/2005 | Galatenko et al. ............. | 716/3 |

* cited by examiner

*Primary Examiner*—Paul Dinh
*Assistant Examiner*—Tuyen To
(74) *Attorney, Agent, or Firm*—Westman, Champlin & Kelly P.A.

(57) ABSTRACT

An iterative process assigns nodes of a new logical tree to positions in a space that was previously assigned to an old logical tree equivalent to the new logical tree. A path in the new tree is identified for an essential node of the new tree. Coordinates of a position in the space are identified for an old tree node that is equivalent to a son of the essential node. Coordinates are iteratively identified for each node in the new tree path using a free space algorithm and based on the nodes of the new tree path and the coordinates identified for the old tree node that is equivalent to the son of the essential node. If all sons of the essential node are leaves of the new tree, the old tree node is a leaf node equivalent to the son. Otherwise, the old tree node is identified in a prior iteration.

20 Claims, 5 Drawing Sheets

PROCESS AND APPARATUS TO ASSIGN COORDINATES TO NODES OF LOGICAL TREES WITHOUT INCREASE OF WIRE LENGTHS

FIELD OF THE INVENTION

This invention relates generally to the field of integrated circuit layout, and particularly to placement of nodes of trees without overcrowding or increasing wire lengths.

BACKGROUND OF THE INVENTION

U.S. Pat. No. 6,564,361 granted May 13, 2003 to Andrej A. Zolotykh et al. for "Method and Apparatus for Timing Driven Resysthesis" and assigned to the same assignee as the present invention, describes techniques for optimizing integrated circuit (IC) designs employing local optimization. Local logic restructuring is a basic step of the resynthesis procedure. One such logic restructuring procedure is described in U.S. Pat. No. 6,543,032 granted Apr. 1, 2003 to Andrej A. Zolotykh et al. for "Method and Apparatus for Local Resynthesis of Logic Trees with Multiple Cost Functions" and assigned to the same assignee as the present invention. The input of the local logic restructuring procedure described in the U.S. Pat. No. 6,543,032 is a logical tree. The result of the local logic restructuring procedure is a new logical tree that is equivalent to the initial tree.

U.S. Pat. No. 6,513,148 granted Jan. 28, 2003 to Elyar E. Gasanov et al. for "Density Driven Assignment of Coordinates" and assigned to the same assignee as the present invention describes a procedure to assign coordinates to nodes of a new logical tree. But the procedure described in the U.S. Pat. No. 6,513,148 leads to increased summary wire length if the resynthesis stage is the area optimization.

IC chips generally comprise a plurality of cells. Each cell may include one or more circuit elements, such as transistors, capacitors and other basic circuit elements, which are interconnected in a standardized manner to perform a specific function.

The timing driven resynthesis described in the U.S. Pat. No. 6,564,361 patent has been used to change the chip design step by step, making the improvements of the chip locally. The main concept of the local resynthesis is to consecutively examine the cell trees of a chip for the necessity of the optimization, and then organize the chosen trees as local tasks for the resynthesis that follows. All necessary information about the tree neighborhood (neighboring cells, capacities, delays, etc.) is first collected. Next, local optimization procedures work with this information only. No additional information about the chip structure is required.

Within the logical resynthesis, ordinary logical cells are considered, i.e. those cells with one output pin constructed using standard logical gates NOT, AND, OR. A logical tree is a tree formed from ordinary logical cells. Inside a logical tree, the output pin of each cell, other than the root (or root cell), is connected to exactly one other input pin, and this one other input pin is a pin of a cell of the logical tree. In contrast, the output pin of the root may be connected to any number of cell input pins. All cells connected with the output pin of the root of a tree may not belong to the tree, and the cells are not necessarily logical. An input pin of a cell of the tree may be connected to the power or the ground, or to a cell outside the tree. The cell input pin may be called the entrances of the tree.

FIG. 1 illustrates an exemplary logical tree that includes six cells inside rectangle 50. All entrances of the tree are enumerated by assigning variables $x_n$ to the entrances. In addition, identical variables may be assigned to entrances connected through a wire because the input values of these entrances are always the same. As shown, for example, the variable $x_1$ is assigned to the first input pin of the cell ND3C and to the first input pin of the cell ENB, the variable $x_2$ is assigned to the second input pin of the cell ENB and to the first input pin of the cell NR2A, the variable $x_3$ is assigned to the input pin of the cell N1C.

One goal of the logical resynthesis is to change a logical tree into a logically equivalent one, which is better with respect to a given estimator. The nodes of the initial logical tree have the coordinates, but it is necessary to assign coordinates to nodes of new logical tree.

The present invention is directed the assignment of coordinates to nodes of a new logical tree without increasing summary wire length or wire congestion.

SUMMARY OF THE INVENTION

In one embodiment of the invention, an iterative process assigns nodes of a new logical tree to positions in a space, wherein the space was previously assigned to an old logical tree that is equivalent to the new logical tree. A path in the new tree is identified for an essential node of the new tree. Coordinates of a position in the space are identified for an old tree node that is equivalent to a son of the essential node. Coordinates are iteratively identified for each node in the new tree path based on the nodes of the new tree path and the coordinates identified for the old tree node that is equivalent to the son of the essential node.

In some forms, if all sons of the essential node are leaves of the new tree, the old tree node is a leaf node equivalent to the son. Otherwise, (if all sons of the essential node are not leaves of the tree) the old tree node is identified in a prior iteration.

In some forms, the process is performed using a free space concept without increasing wire length of the tree.

In other embodiments, a computer useable medium contains a computer readable program comprising computer readable program code for addressing data to cause a computer to carry out the process of the invention.

DETAILED DESCRIPTION OF THE PREFERRED EMBODIMENTS

The present invention finds corresponding essential nodes of old and new trees and uses coordinates of the old node as coordinates of the new node. The degree of a node of a tree is the number of edges incident to the node; an essential node is one having a degree of 2 (two edges). The coordinates of a cell are chosen using the concept of free space, which is the maximal size of a cell that can be placed in that position.

Figure 2:
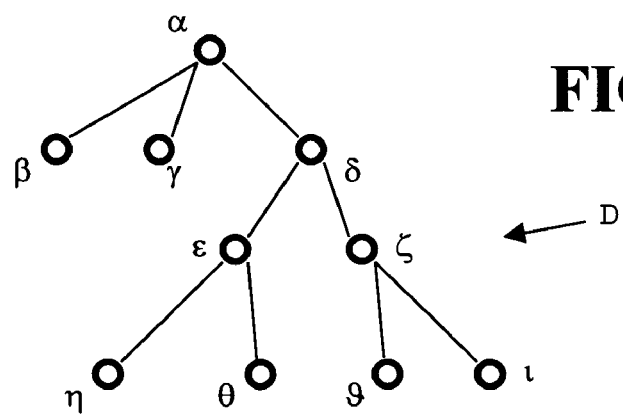
FIG. 2 is an illustration of a logic tree useful to explain certain principles of the present invention.

A tree is a graph without loops with one pole called root. FIG. 2 is an example of a tree D, where node α is the root of the tree, nodes β, γ, δ are sons of node α (node α is the father of the nodes β, γ, δ), nodes ε, ζ are sons of node δ, nodes η, θ, are sons of node ε, and nodes Θ, ι are sons of node ζ. Nodes β, γ, η, θ, Θ, ι are leaves of tree D.

Figure 1:
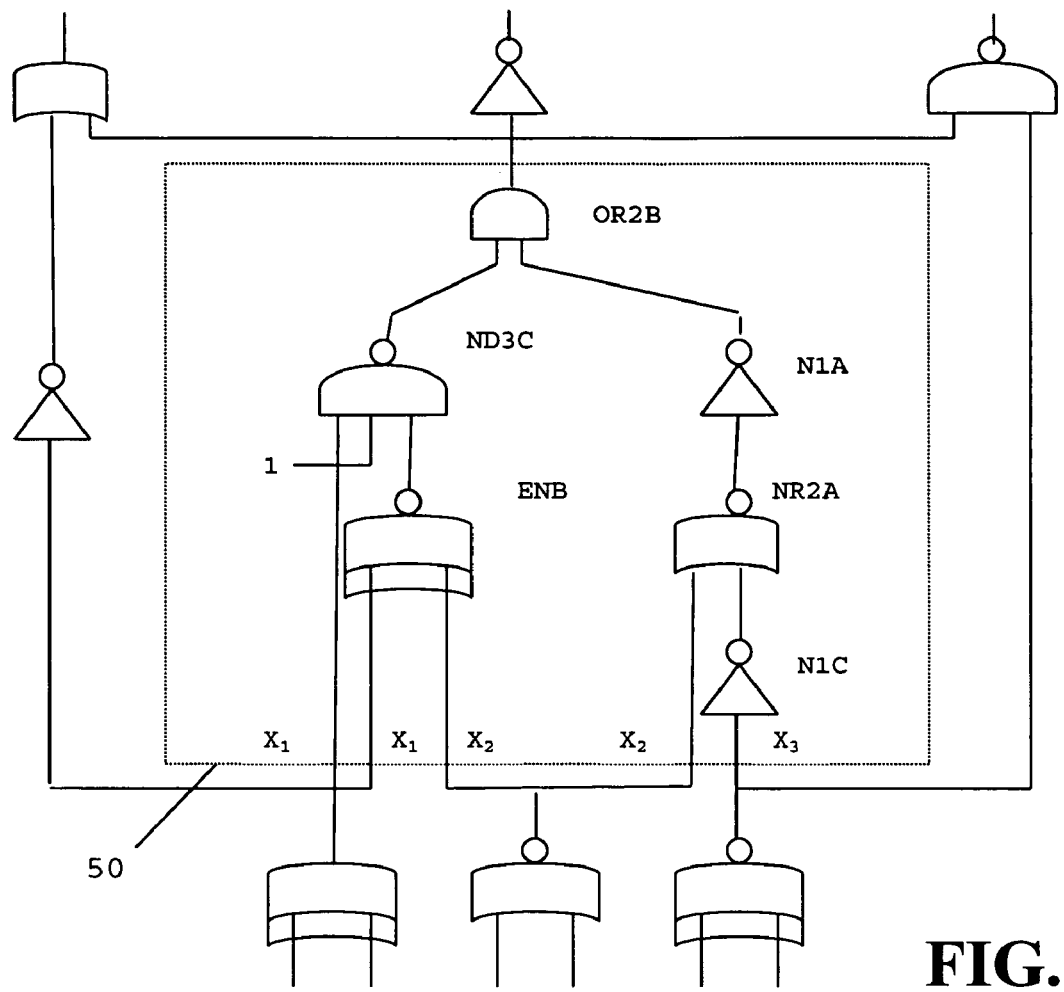
FIG. 1 is a block diagram of an integrated circuit containing a typical tree of logic cells.
Figure 3:
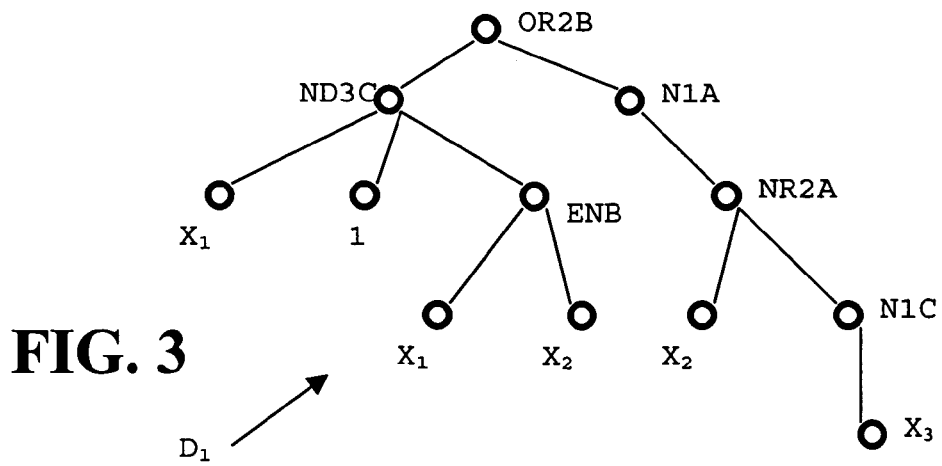
FIGS. 3–5 are illustrations of logic trees that that are equivalent to the circuit of the tree illustrated in FIG. 1.

FIG. 3 illustrates tree $D_1$ which corresponds to the logical tree shown in rectangle 50 in FIG. 1.

Figure 4:
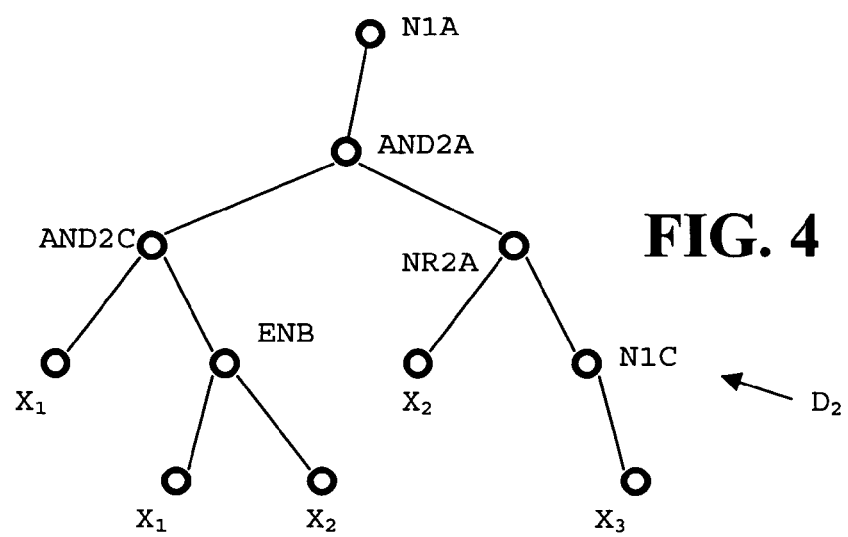
Figure 5:
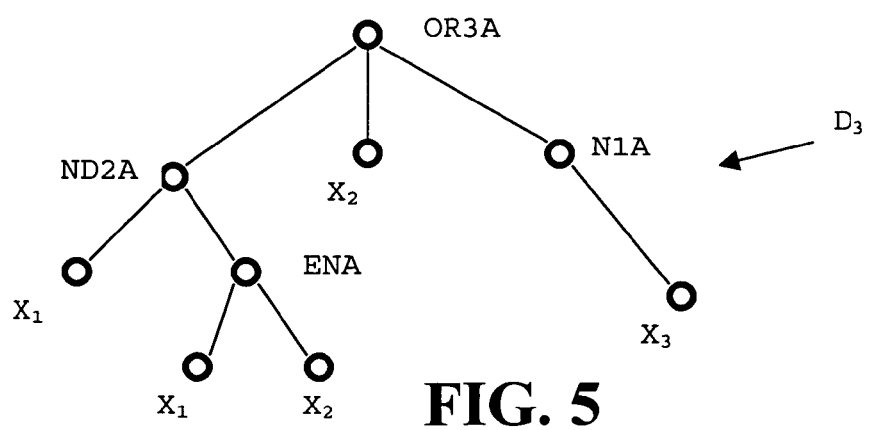

FIGS. 4 and 5 illustrate trees $D_2$ and $D_3$, respectively, both of which are logically equivalent to tree $D_1$ illustrated in FIG. 3.

A node of a tree D is "essential" if the node meets at least one of two conditions. If the node has more than one son, it is essential. If the node has but one son and that son is a variable, the node is essential. If a node is not essential then it is called "simple". For tree $D_1$ shown in FIG. 3, nodes OR2B, ND3C, ENB, NR2A and N1C are essential, and node N1A is simple.

Consider a tree D having a set of nodes $\{\alpha, \alpha_1, \alpha_2, \ldots, \alpha_m\}$ where node α is an essential node and nodes $\alpha_1, \alpha_2, \ldots, \alpha_m$ are simple nodes. Node $\alpha_1$ is the father of the node α, the node $\alpha_2$ is the father of the node $\alpha_1$, the node $\alpha_m$ is the father of the node $\alpha_{m-1}$, and either the father of node $\alpha_m$ is essential or node $\alpha_m$ is the root of tree D. The set $\{\alpha, \alpha_1, \alpha_2, \ldots, \alpha_m\}$ is called the simple path associated with the essential node α. For example, for the tree $D_1$ shown in FIG. 3, the simple path associated with the essential node N1C is {N1C}, the simple path associated with the essential node NR2A is {NR2A, N1A}.

Consider that tree $D_1$ shown in FIG. 3 is a logical tree of a chip. Assume it is desired to replace tree $D_1$ with tree $D_2$ shown in FIG. 4. It is easy to find correspondence between variables of these trees. For example, variable $x_1$, which is the son of node ND3C of tree $D_1$, corresponds to variable $x_1$, which is the son of node AND2C of tree $D_2$; variable $x_1$, which is the son of node ENB of tree $D_1$, corresponds to variable $x_1$, which is the son of node ENB of tree $D_2$.

For purposes of the following description, it is presumed that a correspondence between variables of the old and new logical trees is found.

Figure 6:
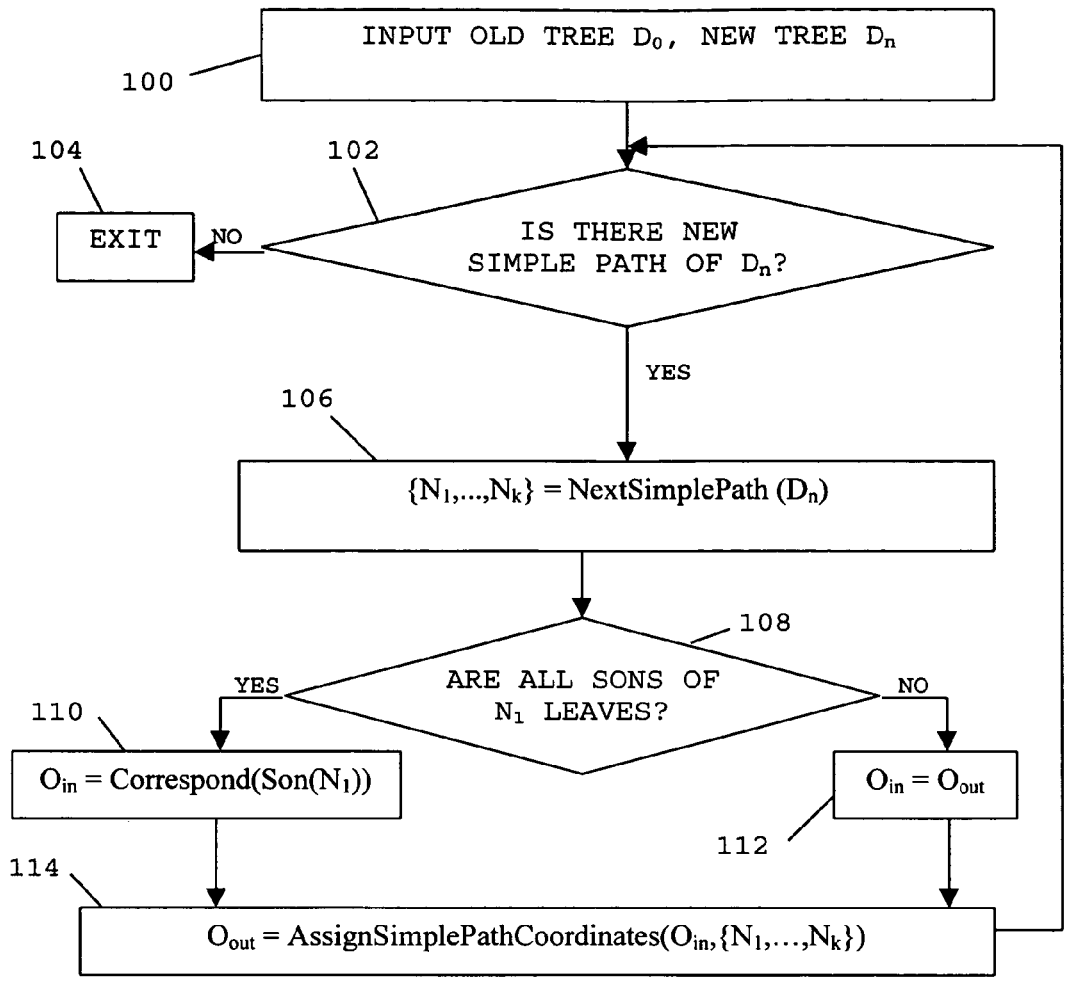
FIGS. 6–8 are flow diagrams of a process of placement of nodes of a tree in accordance with an embodiment of the present invention.

FIG. 6 is a flowchart that shows the basic steps of the procedure to assign coordinates to nodes of the new logical tree. At step 100, the input of the procedure is received, namely an old tree $D_0$ and a new tree $D_n$. It is presumed that a correspondence exists between the leaves of the old and new trees.

All simple paths of new tree $D_n$ are examined. This is accomplished by examining all essential nodes of $D_n$ using a depth-first tree pass algorithm and for each essential nodes, constructing the simple path associated with the essential node. For example, for tree $D_1$ shown in FIG. 3, the simple paths are considered in the following order: {ENB}, {ND3C}, {N1C}, {NR2A, N1A}, {OR2B}.

If at step 102 all simple paths of $D_n$ are considered, then the process exits at step 104. Otherwise the next simple path $\{N_1, \ldots, N_k\}$ of new tree $D_n$ is considered at step 106 where $N_1$ is essential node.

If at step 108 all sons of node $N_1$ are leaves, then at step 110 the node of the old tree $D_0$ which corresponds to some son of node $N_1$ is denoted $O_{in}$ (i.e., $O_{in}$ is a leaf node of the old tree that is equivalent to a son of node $N_1$). If at step 108 at least one son of node $N_1$ is not a leaf, $O_{in}$ is set equal to $O_{out}$, where $O_{out}$ had been obtained at the step 114 for the previous simple path.

Figure 7:
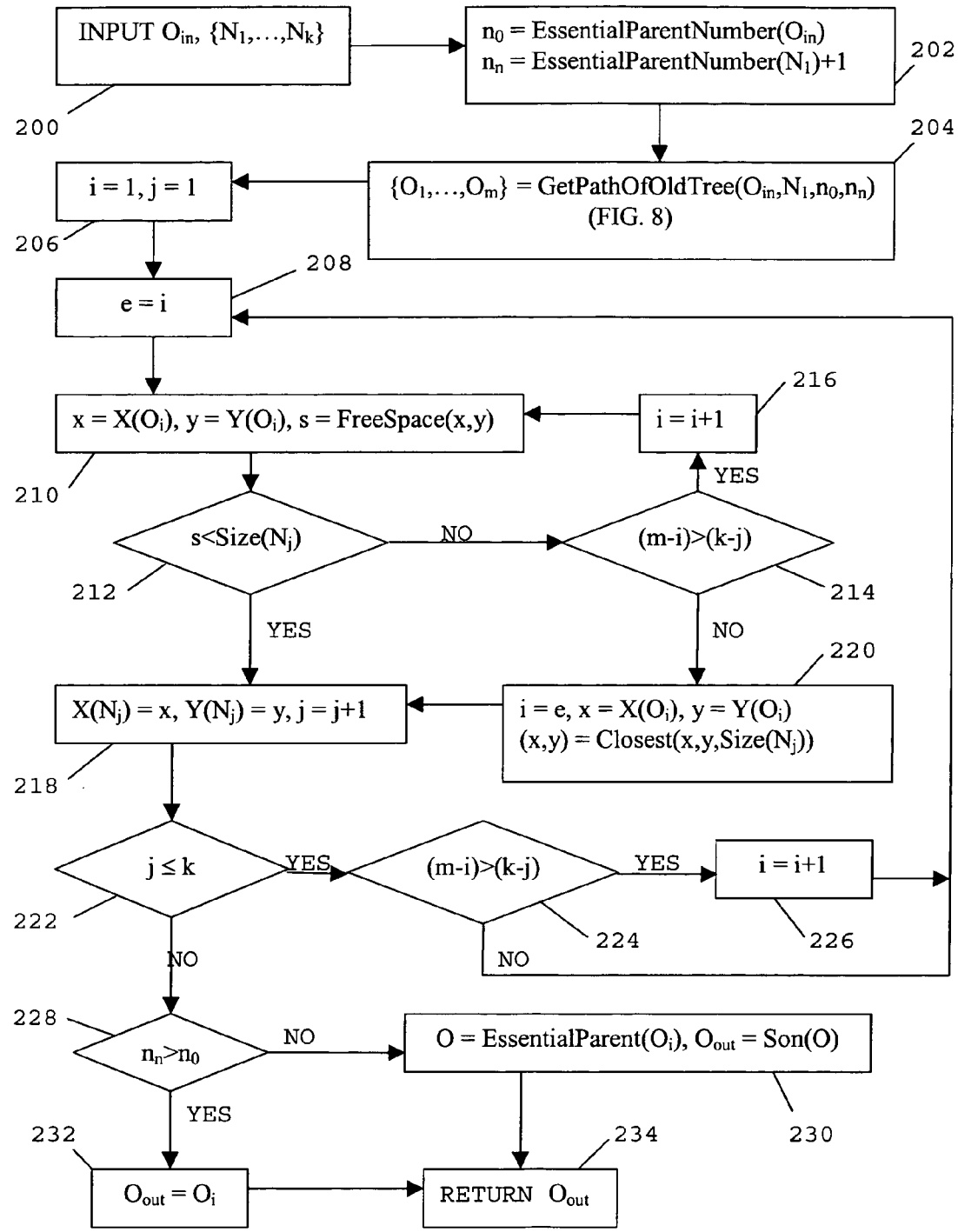

At step 114, coordinates are assigned to nodes $N_1, \ldots, N_k$ using the procedure described in conjunction with FIG. 7. $O_{out}$ is the result of the procedure shown in FIG. 6 and is a node of the old tree $D_0$.

FIG. 7 is a flowchart that shows the basic steps of the process to assign coordinates of nodes of a simple path of the new logical tree. At step 200, the input of the procedure is received, namely a node $O_{in}$ of the old tree, and a simple path $\{N_1, \ldots, N_k\}$ of the new tree. The node $O_{in}$ corresponds to some son of essential node $N_1$.

At step 202, no is calculated as the number of essential parents of node $O_{in}$, and $n_n$ is calculated as the number of essential parents of node $N_1$ plus 1.

Figure 8:
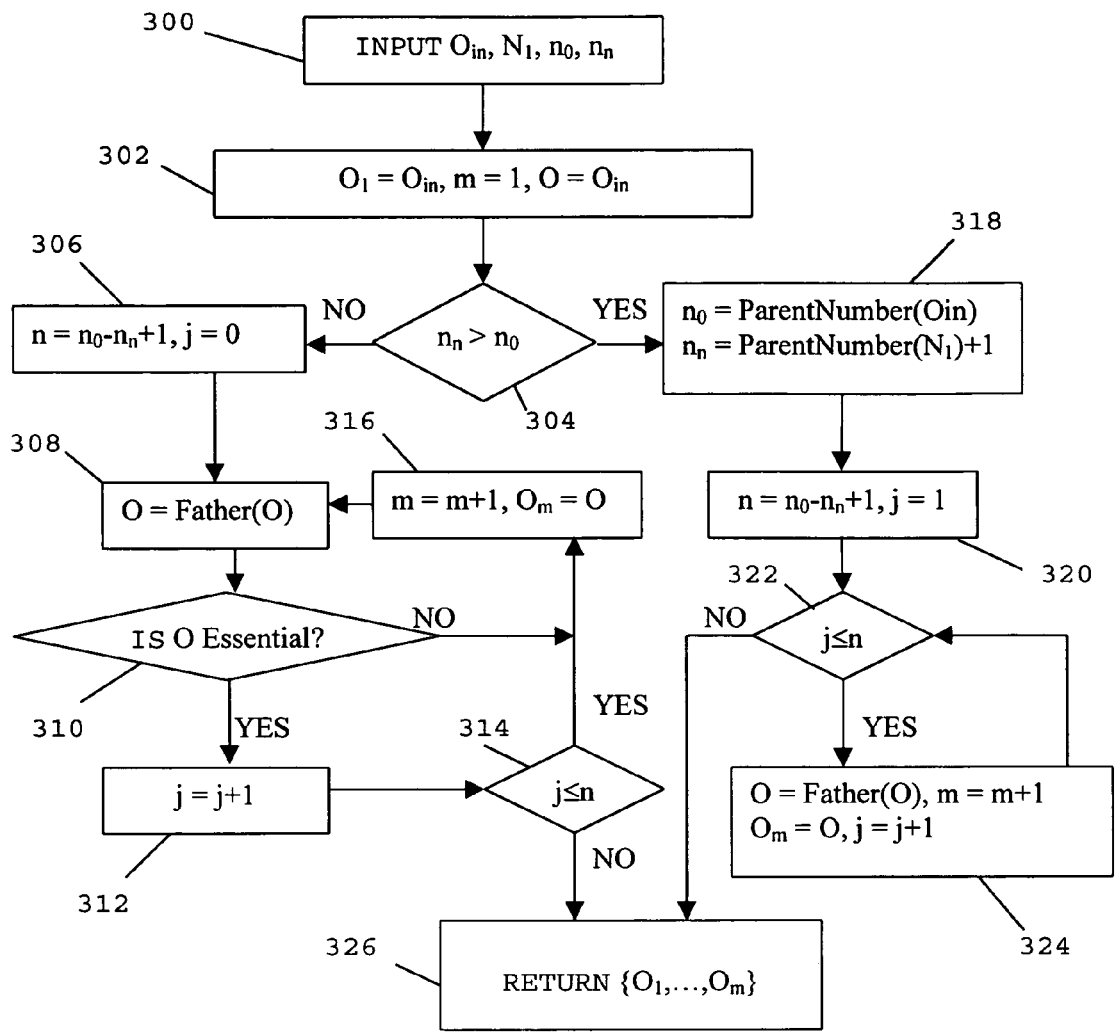

At step 204, a process to get a path of the old tree, shown and described below in conjuction with FIG. 8, is used to get some path of the old tree which begins with node $O_{in}$. $\{O_1, \ldots, O_m\}$ is the result of this procedure. The coordinates of nodes $O_1, \ldots, O_m$ will be used when assigning coordinates to nodes $N_1, \ldots, N_k$.

At step 206, i is set equal to 1 and j is set equal to 1. At step 208, the value of i is saved by setting e equal to i.

At step 210, the (x,y) coordinates of node $O_i$ are identified, and the free space s of the (x,y) position is calculated, such as by the procedure described in U.S. Pat. No. 6,637,016 granted Oct. 21, 2003 to Elyar E. Gasanov et al. for "Assignment of Cell Coordinates" and assigned to the same assignee as the present invention. The coordinates of a cell are chosen using the concept of free space, which is the maximal size of a cell that can be placed in that position.

If at step 212 the value of the free space s less than the size of the node $N_j$, then the process proceeds to step 218. Otherwise the process proceeds to step 214.

If at step 214 the number of remained nodes in the set $\{O_1, \ldots, O_m\}$ is more than the number of remained nodes in the set $\{N_1, \ldots, N_k\}$ (i.e. (m−i)>(k−j)) then the process proceeds to step 216. Otherwise the process proceeds to step 220.

At step 216, i is incremented (i=i+1) and the process loops back to step 210.

If at step 214 (m−i)≦(k−j), then at step 220, the number i is restored to its previous value (i.e. i=e) and the (x,y) coordinates of the node $O_1$ are determined as the closest position to the (x,y) position, where the free space s is more than the size of the node $N_j$. To find such closest position, the procedure described in the U.S. Pat. No. 6,637,016 may be used. The result of this procedure is again denoted by (x/y).

The use of the procedure described in the U.S. Pat. No. 6,637,016 would seemingly increase wire length, but if the procedure is performed in the area optimization mode the summary size of nodes of the old tree is greater than the summary size of nodes of the new tree. Therefore, the procedure of the U.S. Pat. No. 6,637,016 can usually be applied without increasing wire lengths.

At step 218, the coordinates (x,y) are assigned to the node $N_j$ and j is incremented (j=j+1).

If at step 222 all nodes of the set $\{N_1, \ldots, N_k\}$ have been considered (i.e, j>k) then the process proceeds to step 228. Otherwise (if j≦k), the process proceeds to step 224.

If at step 224 the number of remaining nodes in the set $\{O_1, \ldots, O_m\}$ is more than the number of remaining nodes in the set $\{N_j, \ldots, N_k\}$ (i.e. (m−i)>(k−j)), then at step 226 i is incremented (i=i+1) and the process loops back to step 208. Otherwise, (if (m−i)≦(k−j)) i is not incremented and the process loops back to step 208.

If at step 228 $n_n > n_o$ (meaning that the number of essential parents of the node $O_j$ is more than the number of essential parents of the node $N_1$), then the process proceeds to step 232. Otherwise the process proceeds to step 230.

At step 230 the closest essential parent O of node $O_i$ is identified and the output node $O_{out}$ is identified as a son of node O.

At step 232 the output node is identified as node $O_i$ ($O_{out}=O_i$)

In either case, $O_{out}$ is returned at step 234 as result of the procedure.

FIG. 8 is a flowchart illustrating the basic steps of the procedure to get some path of the old tree which begins with node $O_{in}$.

At step 300, the input of the procedure is received, namely a node $O_{in}$ of the old tree, a node $N_1$ of the new tree, a number $n_o$ which is equal to the number of essential parents of the node $O_{in}$, and a number $n_n$ which is equal to the number of essential parents of the node $N_1$ plus one.

At step 302, O is set equal to $O_{in}$ and node $O_{in}$ is added to the output set by setting m=1 and $O_1=O_{in}$. If at step 304 $n_n>n_o$ then the process proceeds to step 318. Otherwise the process proceeds to step 306.

At step 306, the value of n is calculated as $n=n_o-n_n+1$, and j is set to 0 (j=0). At step 308, the father of the node O is considered, i.e. node O is set to the father of node O.

If at step 310, node O is essential then the process proceeds to step 312. Otherwise the process proceeds to step 316 where node O is added to the output set, i.e. set m=m+1 and $O_m=O$. Then the process loops back to step 308 and iterates until a node O is found that is essential.

At step 312, j is incremented (j=j+1) If at step 314 j≦n then the process loops back to step 316 and iterates until j>n, whereupon the process proceeds to step 326.

If at step 304 $n_n>n_o$, then at step 318 $n_o$ is calculated as the number of parents of node $O_{in}$, and $n_n$ is calculated as the number of parents of node $N_1$ plus 1. At step 320, $n=n_o-n_n+1$, and j is set equal to 1.

If at step 322 j≦n, the process proceeds to step 324 where O is set equal to Father (O), j is incremented (j=j+1), and node O is added to the output set, i.e. set m=m+1 and $O_m=O$. Then the process loops back to step 322. If at step 322 j>n, the process proceeds to step 326.

At step 326, the set $\{O_1, \ldots, O_m\}$ is returned as a result of the procedure.

The present invention thus provides a technique to assign nodes of a new tree to a space, such as an integrated circuit design, to replace an old tree. Coordinates for the nodes are found using a free space technique without increasing wire size within the tree or chip. In preferred embodiments, the process is carried out by a computer employing a computer program comprising computer readable program code recorded or embedded on a computer-readable medium, such as a recording disk or other readable device.

Although the present invention has been described with reference to preferred embodiments, workers skilled in the art will recognize that changes may be made in form and detail without departing from the spirit and scope of the invention.

What is claimed is:

1. A process of assigning nodes of a new logical tree to positions in a space previously assigned to an old logical tree equivalent to the new logical tree, the process comprising steps of:
   a) identifying a simple path for an essential node of the new tree;
   b) identifying coordinates of a position in the space of an old tree node equivalent to a son of the essential node, the old tree node being a leaf node equivalent to the son if all sons of the essential node are leaves of the new tree, or
   the old tree node is identified in a prior iteration of step c) if at least one son of the essential node is not a leaf of the new tree; and
   c) identifying coordinates for each node in the simple path based on the coordinates identified for the old tree node equivalent to the son of the essential node and the nodes of a corresponding path in the old tree.

2. The process of claim 1, wherein step c) is performed using values of free space in the new tree relative to the coordinates identified in step c) without increasing wire length of the new tree relative to the old tree.

3. The process of claim 1, wherein the leaves of the new logical tree correspond to leaves of the old logical tree.

4. The process of claim 1, wherein step c) comprises steps of:
   identifying the nodes of the corresponding path in the old tree,
   identifying coordinates of each node along the path in the old tree,
   calculating a free space position of each node of the new path based on a maximal size of a cell placed at the free space position, and
   assigning coordinates to each node in the path in the new tree based on the coordinates of the corresponding node in the old tree.

5. The process of claim 4, wherein the assignment of coordinates to nodes in the path of the new tree comprises iteratively performing steps of:
   identifying whether the free space for the cell of the new tree is greater than the size of the corresponding node in the old tree, and
   defining coordinates for the new tree node closest to the position of the corresponding node in the old tree if the free space is less than the corresponding node size, or
   defining coordinates for the new tree node equal to the position of the corresponding node in the old tree if the free space is not less than the corresponding node size.

6. The process of claim 5, further including steps of:
   comparing the number of essential parents of the node of the old tree, that are equivalent to the son of the essential node the new tree, to the number of essential parents of the son of the essential node, and
   if the number of essential parents of the son of the essential node is greater than the number of essential parents of the node of the old tree equivalent to the son of the new tree, returning the node of the old tree, or
   if the number of essential parents of the son of the essential node is not greater than the number of essential parents of the node of the old tree equivalent to the son of the new tree, returning the son of the essential parent of the node of the old tree.

7. The process of claim 4, further including steps of:
   comparing the number of essential parents of the node of the old tree that are equivalent to the son of the essential node the new tree to the number of essential parents of the son of the essential node, and
   if the number of essential parents of the son of the essential node is greater than the number of essential parents of the node of the old tree equivalent to the son of the new tree, returning the node of the old tree, or
   if the number of essential parents of the son of the essential node is not greater than the number of essential parents of the node of the old tree equivalent to the son of the new tree, returning the son of the essential parent of the node of the old tree.

8. The process of claim 4, wherein the identification of nodes of the corresponding path in the old tree comprises steps of:
comparing the number of parents of the node of the old tree that are equivalent to the essential node of the new tree to the number of parents of the essential node of the new tree, and
if the number of essential parents of the essential node is greater than the number of essential parents of the node of the old tree:
finding a node of the old tree that is a parent to the equivalent node of the old tree, and
returning the node of the old tree, or
if the number of essential parents of the essential node is not greater than the number of essential parents of the node of the old tree:
incrementing the number of parents of the essential node and of the node of the old tree, and
returning the node of the old tree.

9. The process of claim 8, wherein the assignment of coordinates to nodes in the path of the new tree comprises iteratively performing steps of:
identifying whether the free space for the cell of the new tree is greater than the size of the corresponding node in the old tree, and
defining coordinates for the new tree node closest to the position of the corresponding node in the old tree if the free space is less than the corresponding node size, or
defining coordinates for the new tree node equal to the position of the corresponding node in the old tree if the free space is not less than the corresponding node size.

10. The process of claim 8, further including steps of:
comparing the number of essential parents of the node of the old tree that are equivalent to the son of the essential node the new tree to the number of essential parents of the son of the essential node, and
if the number of essential parents of the son of the essential node is greater than the number of essential parents of the node of the old tree equivalent to the son of the new tree, returning the node of the new tree, or
if the number of essential parents of the son of the essential node is not greater than the number of essential parents of the node of the old tree equivalent to the son of the new tree, returning the son of the essential parent of the node of the old tree.

11. A computer useable medium having a computer readable program embodied therein for addressing data to assign nodes of a new logical tree to positions in a space previously assigned to an old logical tree equivalent to the new logical tree, the computer readable program comprising:
first computer readable program code for causing a computer to identify a simple path for an essential node of the new tree;
second computer readable program code for causing the computer to identify whether all sons of the essential node are leaves of the new tree;
third computer readable program code responsive to the second program code identification that all sons of the essential node are leaves of the new tree for causing the computer to identify coordinates of a position in the space of an old tree node equivalent to a son of the essential node;
fourth computer readable program code responsive to the second program code identification that at least one son of the essential node is not a leaf of the new tree for causing the computer to identify coordinates of a position in space of an old tree node identified in a prior iteration of the fifth computer readable program code; and
fifth computer readable program code for causing the computer to identify coordinates for each node in the simple path based on the coordinates identified for the old tree node equivalent to the son of the essential node and the nodes of corresponding path in the old tree.

12. The computer usable medium of claim 11, wherein the fifth computer readable program code causes the computer to execute a free space algorithm without increasing wire length of the tree.

13. The computer usable medium of claim 11, wherein the leaves of the new logical tree correspond to leaves of the old logical tree.

14. The computer usable medium of claim 11, wherein wherein the fifth computer readable program code comprises:
computer readable program code for causing the computer to identify the nodes of the corresponding path in the old tree,
computer readable program code for causing the computer to identify coordinates of each node along the path in the old tree,
computer readable program code for causing the computer to calculate a free space position of each node of the new path based on a maximal size of a cell placed at the free space position, and
computer readable program code for causing the computer to assign coordinates to each node in the path in the new tree based on the coordinates of the corresponding node in the old tree.

15. The computer usable medium of claim 14, wherein the computer readable program code that causes the computer to assign coordinates to nodes in the path of the new tree comprises:
computer readable program code for causing the computer to iteratively compare the free space for each cell to the size of the respective node in the old tree,
computer readable program code responsive to the compare that the free space is less than the node size for causing the computer to define coordinates for the new tree node closest to the position of the corresponding node in the old tree, and
computer readable program code responsive to the compare that the free space is not less than the node size for causing the computer to define coordinates for the new tree node equal to the position of the corresponding node in the old tree.

16. The computer usable medium of claim 15, further including:
computer readable program code for causing the computer to compare the number of essential parents of the node of the old tree, that are equivalent to the son of the essential node the new tree, to the number of essential parents of the son of the essential node,
computer readable program code responsive to the compare that the number of essential parents of the son of the essential node is greater than the number of essential parents of the node of the old tree equivalent to the son of the new tree for causing the computer to return the node of the old tree, and
computer readable program code responsive to the compare that the number of essential parents of the son of the essential node is not greater than the number of essential parents of the node of the old tree equivalent to the son of the new tree for causing the computer to return the son of the essential parent of the node of the old tree.

17. The computer usable medium of claim 14, further including:
   computer readable program code for causing the computer to compare the number of essential parents of the node of the old tree that are equivalent to the son of the essential node the new tree to the number of essential parents of the son of the essential node,
   computer readable program code responsive to the compare that the number of essential parents of the son of the essential node is greater than the number of essential parents of the node of the old tree equivalent to the son of the new tree for causing the computer to return the node of the old tree, and
   computer readable program code responsive to the compare that the number of essential parents of the son of the essential node is not greater than the number of essential parents of the node of the old tree equivalent to the son of the new tree for causing the computer to return the son of the essential parent of the node of the old tree.

18. The computer usable medium of claim 14, wherein the computer readable program code that causes the computer to identify nodes of the corresponding path in the old tree comprises:
   computer readable program code for causing the computer to compare the number of essential parents of the node of the old tree that are equivalent to the essential node of the new tree to the number of essential parents of the essential node of the new tree,
   computer readable program code responsive to a compare that the number of essential parents of the essential node of the new tree is greater than the number of essential parents of the node of the old tree for causing the computer to find a node of the old tree that is a parent to the equivalent node of the old tree and return the node of the old tree, and
   computer readable program code responsive to a compare that the number of essential parents of the essential node of the new tree is not greater than the number of essential parents of the node of the old tree for causing the computer to increment the number of parents of the essential node and of the node of the old tree and return the node of the old tree.

19. The computer usable medium of claim 18, wherein the computer readable program code that causes the computer to assign coordinates to nodes in the path of the new tree comprises:
   computer readable program code for causing the computer to iteratively compare the free space for each cell to the size of the respective node in the old tree,
   computer readable program code responsive to the compare that the free space is less than the node size for causing the computer to define coordinates for the new tree node closest to the position of the corresponding node in the old tree, and
   computer readable program code responsive to the compare that the free space is not less than the node size for causing the computer to define coordinates for the new tree node equal to the position of the corresponding node in the old tree.

20. The computer usable medium of claim 18, further including:
   computer readable program code for causing the computer to compare the number of essential parents of the node of the old tree that are equivalent to the son of the essential node the new tree to the number of essential parents of the son of the essential node,
   computer readable program code responsive to the compare that the number of essential parents of the son of the essential node is less than the number of essential parents of the node of the old tree equivalent to the son of the new tree for causing the computer to return the node of the new tree, and
   computer readable program code responsive to the compare that the number of essential parents of the son of the essential node is not less than the number of essential parents of the node of the old tree equivalent to the son of the new tree for causing the computer to return the son of the essential parent of the node of the old tree.

* * * * *